(12) United States Patent
Shibata (10) Patent No.: US 7,267,911 B2
(45) Date of Patent: Sep. 11, 2007

(54) STENCIL MASK AND ITS MANUFACTURING METHOD

(75) Inventor: Takeshi Shibata, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 596 days.

(21) Appl. No.: 10/743,007

(22) Filed: Dec. 23, 2003

(65) Prior Publication Data

US 2004/0147125 A1    Jul. 29, 2004

(30) Foreign Application Priority Data

Dec. 26, 2002   (JP)   ............... 2002-376212

(51) Int. Cl.
   *G03F 9/00*   (2006.01)
(52) U.S. Cl. ........................................ 430/5
(58) Field of Classification Search ............ 430/5
   See application file for complete search history.

(56) References Cited

U.S. PATENT DOCUMENTS

| 6,770,402 | B2* | 8/2004 | Suguro et al. | ............... | 430/5 |
| 7,094,612 | B2* | 8/2006 | Shibata et al. | ............... | 438/5 |
| 2002/0058400 | A1 | 5/2002 | Suguro et al. | | |

FOREIGN PATENT DOCUMENTS

| JP | 5-216216 | 8/1993 |
| JP | 2001-237072 | 8/2001 |
| JP | 2002-203806 | 7/2002 |
| JP | 2002-343710 | 11/2002 |
| JP | 2003-37055 | 2/2003 |
| JP | 2003-133218 | 5/2003 |
| JP | 2003-151890 | 5/2003 |

OTHER PUBLICATIONS

Notification of Reasons for Rejection mailed Jul. 5, 2005, issued by the Japanese Patent Office in counterpart Japanese Application No. 2002-376212 and English translation thereof.
Notification for Filing Opinion mailed Nov. 26, 2005, issued by the Korean Patent Office in counterpart Application No. 10-2003-97297 and English language translation thereof.

* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

A stencil mask has a silicon thin film in which an opening pattern is formed, a silicon oxide film, and a support part. The silicon thin film has a two-layer structure of a first silicon thin film and a second silicon thin film stacked one on top of the other. The first and second silicon thin films enable microscopic openings to be made in them. Stacking the first and second silicon thin films one on top of the other makes it possible to achieve the necessary strength and increase the strength of the stencil mask.

16 Claims, 9 Drawing Sheets

STENCIL MASK AND ITS MANUFACTURING METHOD

CROSS-REFERENCE TO RELATED APPLICATIONS

This application is based upon and claims the benefit of priority from the prior Japanese Patent Application No. 2002-376212, filed Dec. 26, 2002, the entire contents of which are incorporated herein by reference.

BACKGROUND OF THE INVENTION

1. Field of the Invention

This invention relates to a stencil mask used in semiconductor processes, and its manufacturing method.

2. Description of the Related Art

In semiconductor device manufacturing, when a plurality of MOSFETs (Metal Oxide Semiconductor Field-Effect Transistors) differing in the conductivity type of channel are formed in a substrate, or when MOSFETs differing in threshold voltage are formed in a substrate, impurity ions are implanted into the wells, channels, or polysilicon layers. When ions are implanted, a stencil mask with openings is provided above a semiconductor substrate at a specific distance apart.

A stencil mask is used to project particles or electromagnetic waves onto a substrate to be processed. Particles include, for example, charged particles, such as electrons or ions, and neutral particles, such as atoms, molecules, or neutrons. Electromagnetic waves include light and X rays.

FIGS. 15A to 15D show conventional stencil mask manufacturing processes. A stencil mask is generally manufactured using an SOI (Silicon On Insulator) substrate 1000. Hereinafter, the processes of manufacturing a stencil mask will be explained.

Figure 15A:
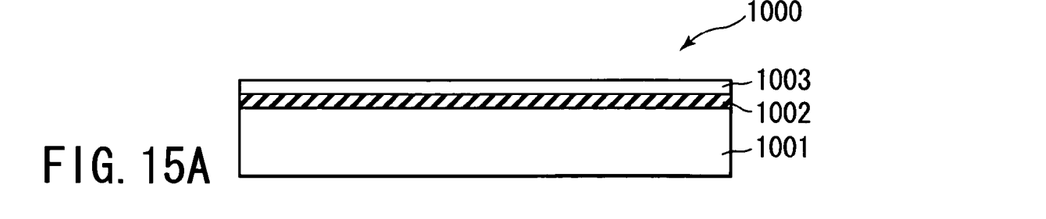
FIGS. 15A to 15D are sectional views showing the processes of manufacturing a stencil mask in the prior art.

FIG. 15A shows an ordinary SOI substrate 1000. The SOI substrate 1000 is formed by, for example, implanting oxygen ions into a silicon substrate and then annealing the resulting substrate at high temperature. A silicon oxide film 1002 is formed at a depth of several tens to several hundreds of nanometers from the top of the silicon substrate 1001. On the silicon oxide film 1002, a silicon thin film 1003 is formed.

Figure 15B:
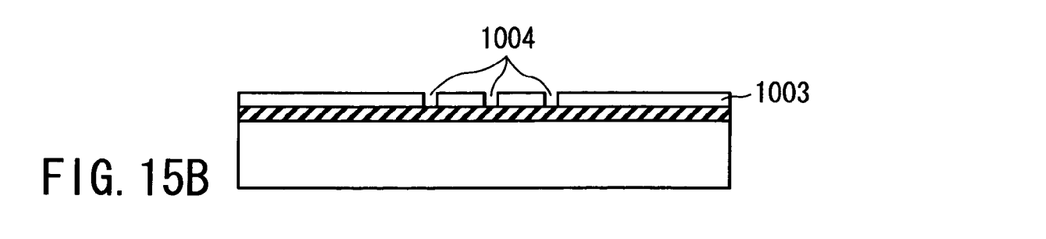

Next, as shown in FIG. 15B, a resist (not shown) is applied to the surface of the silicon thin film 1003. The resist is processed by lithographic techniques, thereby forming a resist pattern. Thereafter, with the resist as a mask, the silicon thin film 1003 is etched anisotropically until the silicon oxide film 1002 is exposed. After openings 1004 are made in the silicon thin film 1003, the resist pattern is removed.

Figure 15C:
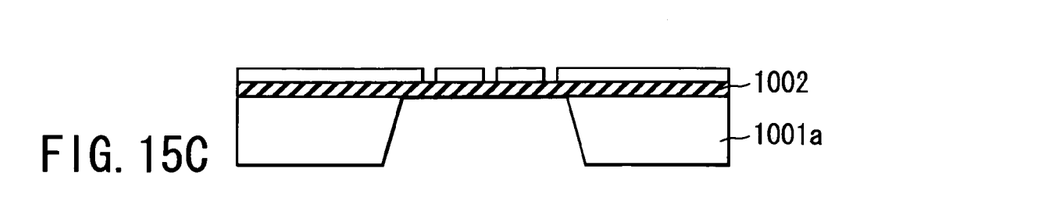

Next, as shown in FIG. 15C, a resist (not shown) is applied to the back of the silicon substrate 1001. The resist is processed by lithographic techniques, thereby forming a resist pattern. Thereafter, the silicon substrate 1001 is etched isotropically with chemical liquid, such as KOH. Specifically, the part of the silicon substrate 1001 where no resist pattern has been formed is etched isotropically until the silicon oxide film 1002 is exposed, thereby forming a support part 1001a. Thereafter, the resist pattern is removed.

Figure 15D:
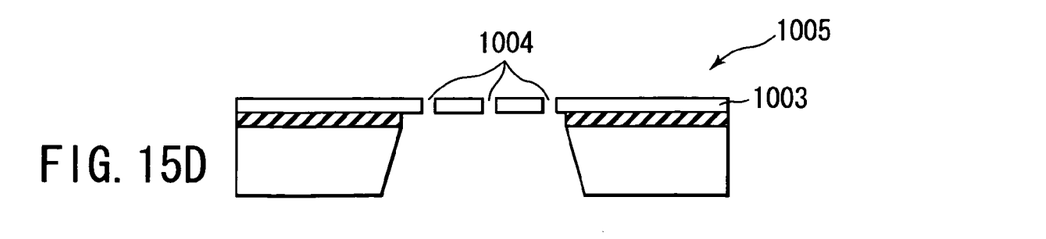

Next, as shown in FIG. 15D, the silicon oxide film 1002 exposed in the process of FIG. 15C is processed from its back with chemical liquid, such as fluoric acid, thereby removing the silicon oxide film 1002 and exposing the silicon thin film 1003. In this way, a stencil mask 1005 with the openings 1004 is formed. A stencil mask with such a configuration has been disclosed in, for example, Jpn. Pat. Appln. KOKAI Publication No. 2002-203806.

Figure 16A:
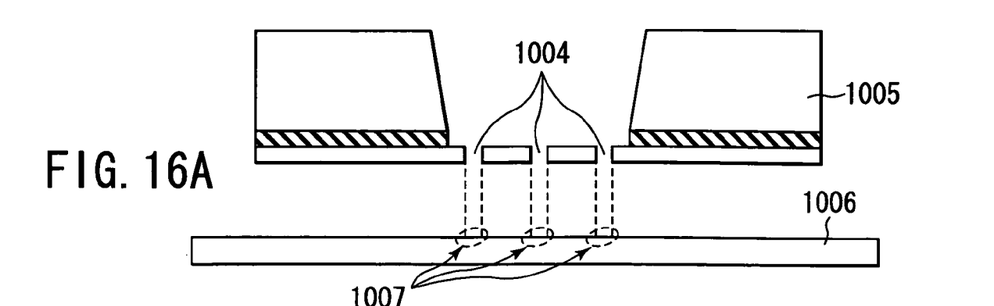
FIGS. 16A and 16B are sectional views showing the positional relationship between a stencil mask and a substrate to be processed (a semiconductor substrate) in implanting ions.
Figure 16B:
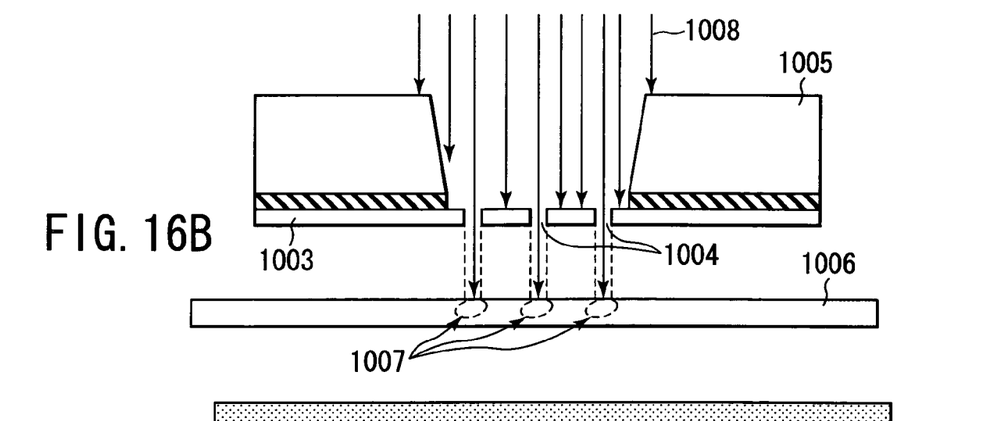

FIGS. 16A and 16B show the positional relationship between the stencil mask and a substrate to be processed in, for example, implanting ions.

As shown in FIG. 16A, the stencil mask 1005 is provided above a semiconductor substrate 1006. The openings 1004 in the stencil mask 1005 are caused to coincide with specific ion implantation regions 1007 of the semiconductor substrate 1006.

Next, as shown in FIG. 16B, impurity ions 1008 pass through the openings 1004 in the stencil mask 1005 and are implanted into the ion implantation regions 1007 of the semiconductor substrate 1006. Since there is no opening 1004 in the non-implantation region, impurity ions 1008 are cut off by the stencil mask 1005.

In this way, the stencil mask 1005 cuts off impurity ions 1008 repeatedly, allowing the cut-off impurity ions 1008 to be accumulated on the stencil mask 005. The repetitive collision of impurity ions 1008 damages the stencil mask 1005. In addition, since the silicon thin film 1003 in which the openings 1004 are made is thin, it is expected that the film will be deformed due to a load caused by gravity or inertial force during transportation or movement. The deflection strength of the silicon thin film depends on physical properties, including Young's modulus, and the area of the thin film region. Generally, the strength of the film is proportional to the cube of the film thickness. Therefore, making the film thickness of the stencil mask 1005 thicker enables the strength to increase, which prevents the stencil mask 1005 being deformed as a result of the ion implantation described above.

On the other hand, as described above, the openings 1004 in the stencil mask 1005 are made by processing the SOI substrate 1000 by anisotropic etching. Therefore, the accuracy of the openings 1004 in the stencil mask 1005 depends on the material and thickness of the film to be processed. Generally, the processing accuracy depends on the ratio of the opening dominions to the depth direction (film thickness). This is called the aspect ratio. Accordingly, when a film is thick, the opening dimensions of an opening made in the film become large, making microfabrication difficult. Conversely, when a film is thin, an opening with small opening dimensions can be made. Therefore, making the film thickness of the stencil mask 1005 thicker to increase the strength makes it difficult to make microscopic openings 1004.

Furthermore, in the process of manufacturing semiconductor devices, there may be a case where ions are implanted diagonally or a stencil mask is used in a reduction exposure process. In this case, particles are directed diagonally at the stencil mask provided in parallel with the semiconductor substrate.

Figure 17:
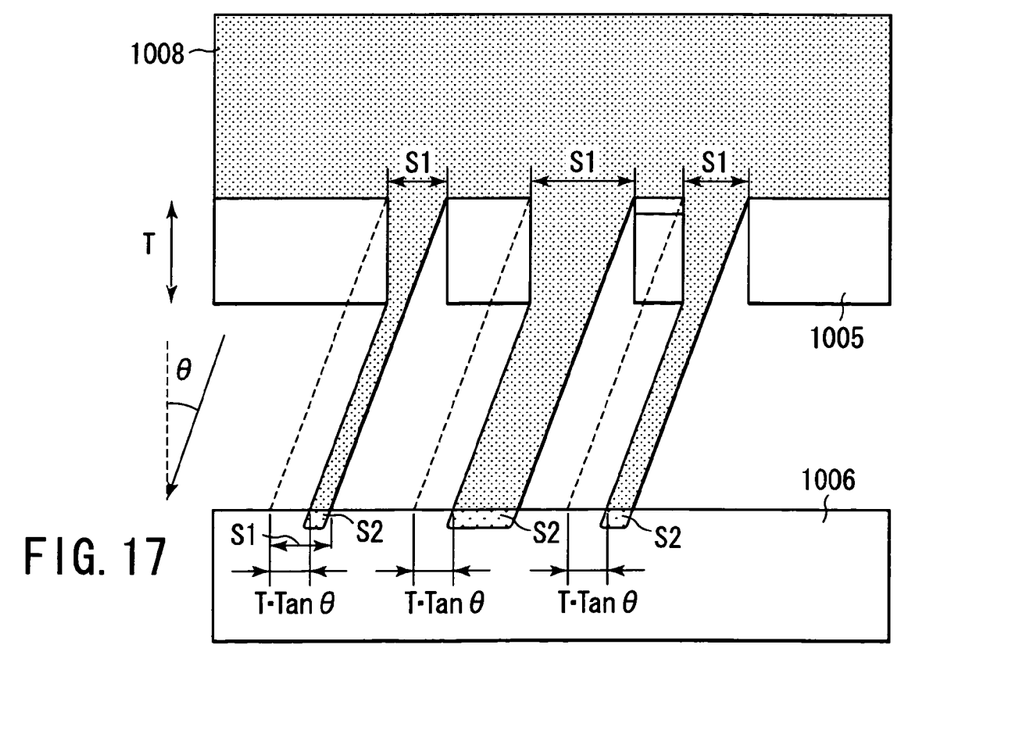
FIG. 17 is a sectional view showing the positional relationship between a stencil mask and a substrate to be processed (a semiconductor substrate) in implanting ions diagonally.

FIG. 17 shows a case where particles are directed diagonally by use of the stencil mask 1005 with openings 1004 processed perpendicularly to the surface by anisotropic etching. In this case, there arises a problem: part or all of the particles passing through the openings 1004 are obstructed by the sidewalls of the openings 1004 in the stencil mask 1005, and therefore particles do not reach the semiconductor substrate. Such a phenomenon is called shadowing.

The influence of shadowing will be explained by reference to FIG. 17. Suppose charges particles are directed at an angle of θ at a stencil mask for forming an implantation region of a substrate to be processed. If the film thickness of the stencil mask is T, each of the opening dimension of the stencil mask and the dimension of the implantation region of the substrate to be processed is S1, and the dimension of the region of the substrate into which charged particles are implanted is S2, S2 is expressed by the following equation:

$$S2 = S1 - T \cdot \tan\theta$$

As seen from the above equation, of the region S1 into which ions are supposed to be implanted, only the region expressed by T·tan θ is cut off by the stencil mask. The larger the incident angle becomes, the larger the cut-off region becomes. In addition, the thicker the film thickness T of the stencil mask, the larger the cut-off region becomes. For this reason, it is impossible to secure the desired implantation region S1. Consequently, when the silicon thin film is made thicker, to increase the strength of the stencil mask, the percentage of cut-off particles, caused by shadowing, becomes larger. To overcome this problem, a stencil mask which enables microscopic openings to be made, while maintaining adequate strength, and a method of manufacturing the stencil mask, are required.

BRIEF SUMMARY OF THE INVENTION

According to a first aspect of the present invention, there is provided a stencil mask comprising: a transfer mask which is configured by a plurality of thin films stacked one on top of another, each of the thin films having a first opening, the transfer mask has a second opening which is configured by the first openings; and a support part formed on one face of the transfer mask.

According to a second aspect of the present invention, there is provided a stencil mask comprising: a first thin film which has a first opening of a specific pattern in it; a second thin film which is stacked on one side of the first thin film and has the same pattern as that of the first opening; and a support part formed on the other side of the first thin film.

According to a third aspect of the present invention, there is provided a stencil mask comprising: a first thin film which has a first opening in it; and a second thin film which is stacked on one side of the first thin film and has a second opening whose dimensions are smaller than those of the first opening.

According to a fourth aspect of the present invention, there is provided a stencil mask comprising: a first thin film which has a first region, a second region, and a third region, the first region and the second region each having a first opening; a second thin film which is stacked on one side of the first thin film and has a fourth region corresponding to the first region, a fifth region corresponding to the second region, and a sixth region corresponding to the third region and which a second opening in each of the fourth region and the fifth region; and a support part formed in a region corresponding to the third region on the other side of the first thin film, the first thin film and the second thin film not being bonded together between the first region and the fourth region but being bonded between the second region and the fifth region and between the third region and the sixth region.

According to a fifth aspect of the present invention, there is provided a stencil mask manufacturing method comprising: forming a first and a second thin film on a first and second substrate respectively, forming a third and a fourth thin film on the first and second thin films respectively, forming a specific pattern of opening in an opening region in each of the third and fourth thin films, and producing a first intermediate product substrate made up of the first substrate and a second intermediate product substrate made up of the second substrate; forming a support part by removing the first substrate corresponding to the opening region in the first intermediate product substrate until the first thin film is exposed; removing the exposed first thin film; bonding together the third thin film of the first intermediate product substrate from which the first thin film has been removed and the fourth thin film of the second intermediate product substrate; and removing the second substrate of the second intermediate product substrate and the second thin film.

According to a sixth aspect of the present invention, there is provided a stencil mask manufacturing method comprising: forming a first and a second thin film on a first and second substrate respectively, forming a third and a fourth thin film on the first and second thin films respectively, forming a specific pattern of opening in an opening region in each of the third and fourth thin films, and producing a first and a second intermediate product substrate; forming a fifth thin film on a third substrate, forming on the fifth thin film a sixth thin film whose electrical conductivity or thermal conductivity is higher than the electrical conductivity or thermal conductivity of each of the third and fourth thin films, forming a specific pattern of opening in an opening region of the sixth thin film, and producing a third intermediate product substrate; forming a support part by removing the first substrate corresponding to the opening region of the first intermediate product substrate until the first thin film is exposed; removing the exposed first thin film; bonding together the third thin film of the first intermediate product substrate from which the first thin film has been removed and the sixth thin film of the third intermediate product substrate; producing a fourth intermediate product substrate by removing the third substrate and the fifth thin film; bonding together the sixth thin film of the fourth intermediate product substrate from which the fifth thin film has been removed and the fourth thin film of the second intermediate product substrate; and removing the second substrate and the second thin film.

DETAILED DESCRIPTION OF THE INVENTION

Referring to the accompanying drawings, embodiments of the present invention will be explained.

First Embodiment

Figure 1:
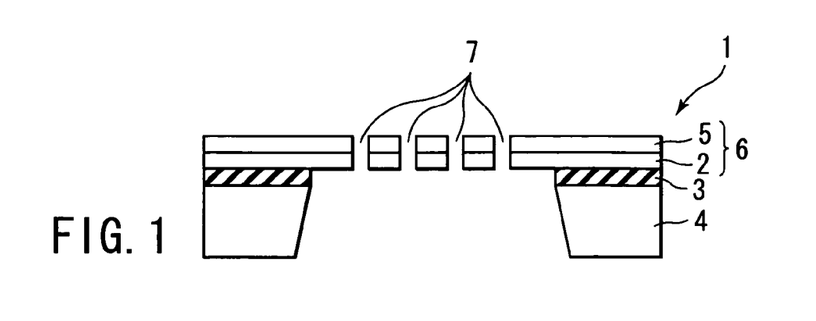
FIG. 1 is a sectional view of a stencil mask according to a first embodiment of the present invention.

FIG. 1 is a sectional view of a stencil mask according to a first embodiment of the present invention. A stencil mask 1 comprises a support part 4, a silicon oxide film 3 formed on the support part 4, and a silicon thin film 6 which is formed on the silicon oxide film 3 and serves as a transfer mask. Openings 7 are made in the silicon thin film 6. The silicon thin film 6 in which the openings 7 are made is constructed by stacking a first silicon thin film 2 and a silicon thin film 5 one on top of the other.

In the first and second silicon thin films 2, 5, the openings 7 are made by etching thin silicon films anisotropically. Since the first and second silicon thin films are thin, they can be processed microscopically. Therefore, an opening pattern with small opening dimensions can be formed.

FIGS. 2A to 2F are sectional views showing the processes of manufacturing a stencil mask of the first embodiment. The stencil mask 1 is produced using two SOI substrates.

Figure 2A:
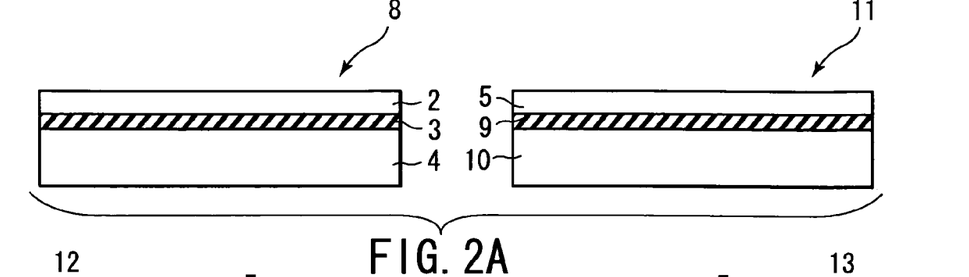
FIGS. 2A to 2F are sectional views showing the processes of manufacturing a stencil mask of the first embodiment.

FIG. 2A shows a first and a second SOI substrate 8, 11. The first and second SOI substrates 8, 11 are manufactured using, for example, the same processing step. First, for example, after oxygen ions are implanted into the first and second silicon substrates 4, 10, the resulting substrates are annealed at high temperature. As a result, a first and a second oxide film 3, 9 are formed at a depth of several tens or several hundreds of nanometers from the surfaces of the first and second silicon oxide films 4, 10, respectively. On the first and second silicon oxide films 3, 9, the first and second silicon thin films 2, 5 are formed respectively. An SOI substrate manufacturing method is not limited to this and an SOI substrate may be formed by another manufacturing method, such as a laminating method.

Figure 2B:
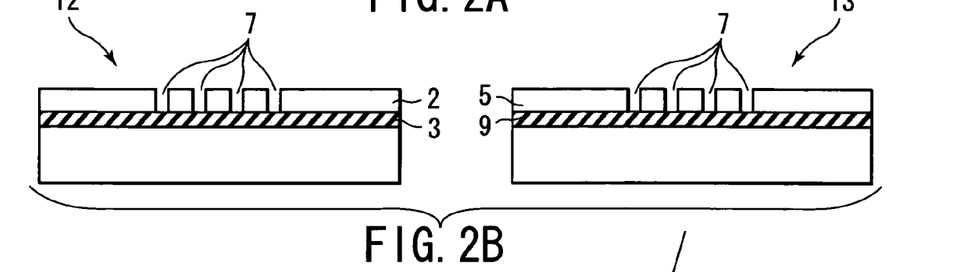

Next, as shown in FIG. 2B, a resist (not shown) is applied to the surfaces of the first and second silicon thin films 2, 5. Then, resist patterns are formed by lithographic techniques. Thereafter, with the resist patterns as masks, the first and second silicon thin films 2, 5 are etched anisotropically until the first and second silicon oxide films 3, 9 are exposed. In this way, the openings 7 are made in each of the first and second silicon thin films 2, 5. Thereafter, the resist pattern is removed. The first and second SOI substrates 8, 11 processed up to this point are used as a first and a second intermediate product 12, 13. Here, the second SOI substrate 11 is determined to be a second intermediate product substrate 13 and the process is stopped temporarily.

Figure 2C:
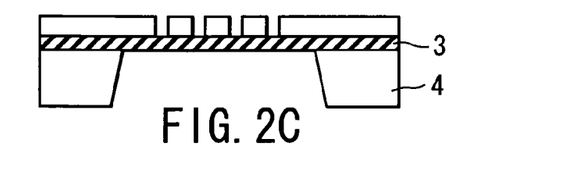

Next, as shown in FIG. 2C, a resist is applied to the back of the first silicon substrate 4 of the first intermediate product substrate 12. Then, a resist pattern is formed by lithographic techniques. Thereafter, with the resist pattern as a mask, the first silicon substrate 4 is treated with chemical liquid, such as KOH. The part of the first silicon substrate 4 where no resist has been formed is etched isotropically until the first silicon oxide film 3 is exposed. In this way, the support part 4 is formed. Thereafter, the resist pattern is removed.

Figure 2D:
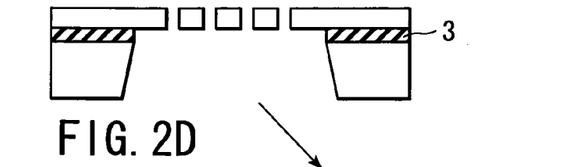

Then, as shown in FIG. 2D, the first silicon oxide film 3 exposed in the process of FIG. 2C is processed from its back with chemical liquid, such as fluoric acid, thereby removing the first silicon oxide film 3.

Figure 2E:
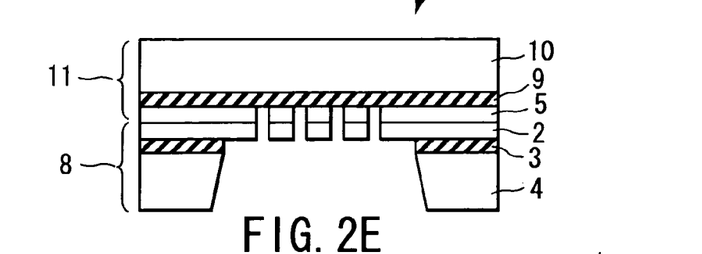

Next, as shown in FIG. 2E, the second silicon thin film 5 of the second intermediate product substrate 13 whose processing of FIG. 2B has been temporarily stopped is stacked on the first silicon thin film 2 processed in the manufacturing steps up to FIG. 2D. Thereafter, the first silicon thin film 2 and second thin film 5 are bonded together by high-temperature heat treatment. When the first silicon thin film 2 and the second silicon thin film are stacked one on top of the other, it is necessary to prevent air from entering between the two silicon thin films. Therefore, it is desirable that the silicon thin films be stacked in a vacuum.

The method of bonding together the first and second silicon thin films 2, 5 is not limited to the first embodiment. For instance, an adhesive member may be inserted between the first silicon thin film 2 and the second silicon thin film 5.

Figure 2F:
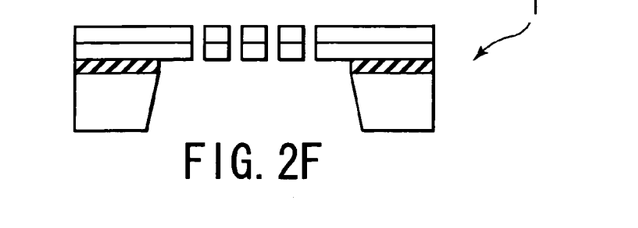

Next, as shown in FIG. 2F, the second silicon substrate 10 is treated with chemical liquid, such as KOH, thereby removing the second silicon substrate 10. Then, the second silicon oxide film 9 is treated with chemical liquid, such as fluoric acid, thereby removing the second silicon oxide film 9. In this way, the stencil mask 1 of the first embodiment is formed.

With the first embodiment, in a state where silicon thin films are thin, the first and second silicon thin films 2, 5 are etched independently. As a result, the openings 7 with small opening dimensions can be made in the first and second silicon thin films 2, 5.

Furthermore, stacking the microscopically processed first and second silicon thin films 2, 5 makes the film thickness of the silicon thin film 6 of the stencil mask 1 equal to the sum of the film thickness of the first silicon thin film 2 and that of the second silicon thin film 5. Therefore, the strength of the stencil mask 1 is increased. As described in the prior art, the strength of a film is proportional to the cube of the film thickness. Consequently, when the film thickness of a silicon thin film is doubled, an eight-fold increase in the strength can be achieved.

In the process of manufacturing the stencil mask 1, one stencil mask 1 has been formed from two SOI substrates 8, 11. The first embodiment is not limited to this. For instance, one stencil mask 1 may be formed from, for example, three SOI substrates.

Figure 3A:
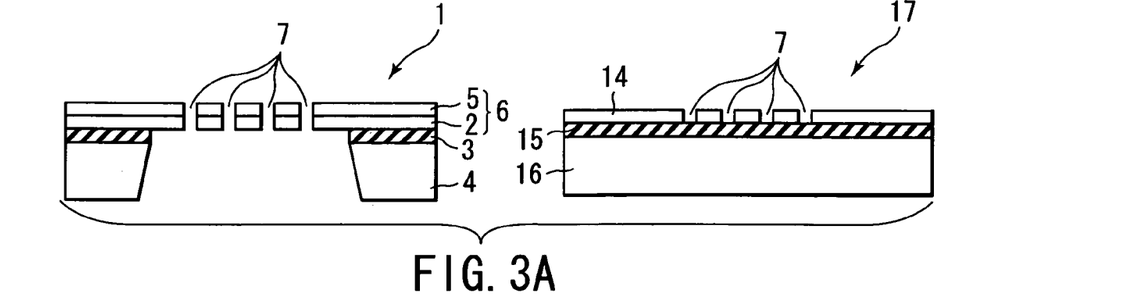
FIGS. 3A to 3C are sectional views showing the processes of manufacturing a stencil mask of the first embodiment from three SOI substrates.

FIGS. 3A to 3C show a case where one stencil mask is formed from, for example, three SOI substrates. As shown in FIG. 3A, a stencil mask 18 is formed out of the stencil mask 1 produced from the first and second SOI substrates 8, 10 in the manufacturing processes of FIGS. 2A to 2F and a third intermediate product substrate 17. In the third intermediate product substrate 17, a third SOI substrate is composed of a third silicon substrate 16, a third silicon oxide film 15, and a third silicon thin film 14. The third SOI substrate is processed as in the manufacturing processes from FIGS. 2A to 2B, thereby forming the third intermediate product substrate 17 with the third silicon thin film 14 in which openings 7 have been made.

Figure 3B:
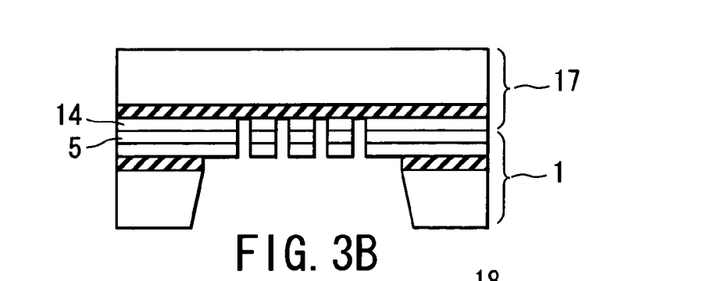

Next, as shown in FIG. 3B, the third silicon thin film 14 of the third intermediate product substrate 17 is stacked on the second silicon thin film 5 of the stencil mask 1. Thereafter, the second silicon thin film 5 and the third silicon thin film 14 are bonded together by high-temperature heat treatment.

Figure 3C:
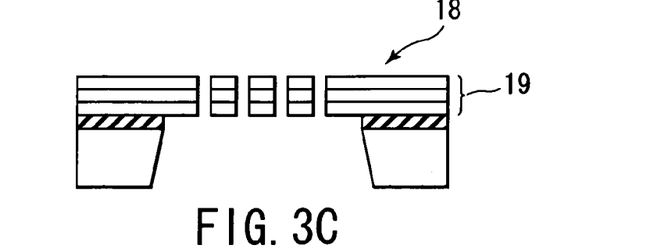

Next, as shown in FIG. 3C, the third silicon substrate 16 is treated with chemical liquid, such as KOH, thereby removing the third silicon substrate 16. Then, the third silicon oxide film 15 is treated with chemical liquid, such as fluoric acid, thereby removing the third silicon oxide film 15. In this way, a stencil mask 18 composed of three layers of silicon thin films 19 stacked one on top of another is formed. Even when three silicon thin films 19 are stacked one on top of another, microfabrication is possible since the stacked films are as thick as one silicon thin film in forming an opening pattern. Moreover, stacking three silicon thin films one on top of another achieves the strength three times that of one silicon thin film.

Second Embodiment

Figure 4A:
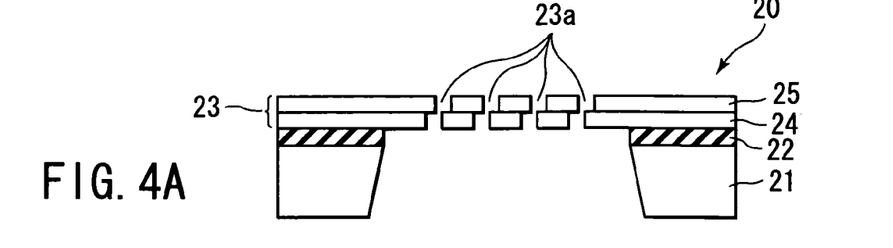
FIGS. 4A and 4B are a sectional view of a whole stencil mask according to a second embodiment of the present invention and an enlarged sectional view of an opening pattern region, respectively.
Figures 4B, 5:
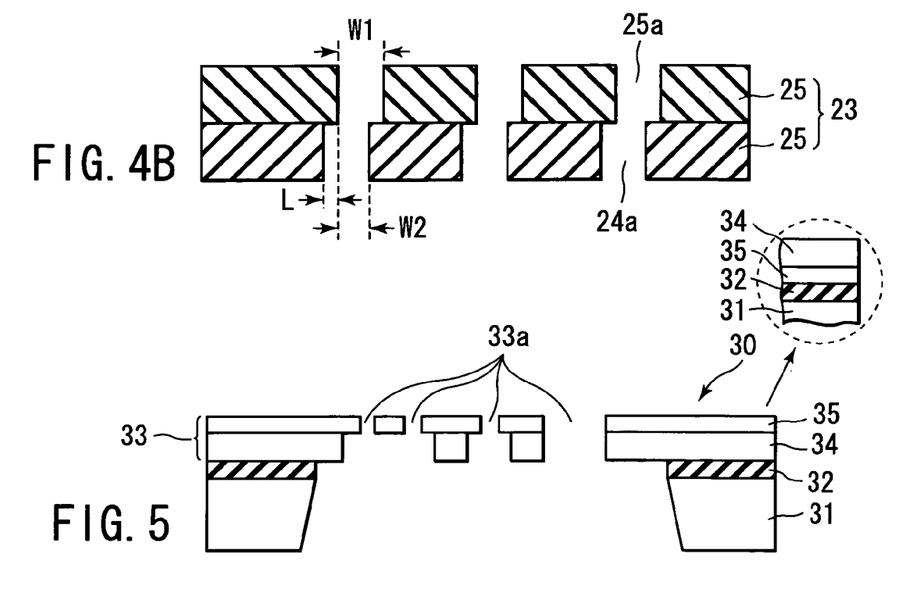
FIG. 5 is a sectional view of a stencil mask according to a third embodiment of the present invention.

Next, a stencil mask according to a second embodiment of the present invention will be explained by reference to FIGS. 4A and 4B. In the second embodiment, openings substantially smaller than the openings in the first embodiment can be formed. FIG. 4A is a sectional view of a whole stencil mask 20 according to the second embodiment. FIG. 4B is an enlarged sectional view of an opening pattern part of the stencil mask 20 in FIG. 4A.

As shown in FIG. 4A, like the stencil mask 1 of the first embodiment, a stencil mask 20 is composed of a silicon thin film 23 formed above a support part 21 with a silicon oxide film 22 between the silicon thin film and the support section 21. The silicon thin film 23 has openings 23a made in it. The silicon thin film 23 is composed of a first silicon thin film 24 and a second silicon thin film 25 stacked on top of the other.

As shown in FIG. 4B, the first silicon thin film 24 has a plurality of openings 24a and the second silicon thin film 25 has a plurality of openings 25a. The size of the opening 24a is made equal to the size of the opening 25a. In a state where the first silicon thin film 24 and the second silicon thin film 25 are stacked one on top of the other, the openings 24a in the first silicon thin film 24 are shifted from the openings 25a in the second silicon thin film 25 by a width of L. Therefore, in a case where the smallest width allowing the opening dimensions of the first silicon thin film 24 to be processed is W1, when the second silicon thin film 25 is stacked on top of the silicon thin film 24 in such a manner that the former is shifted from the latter by a width of L, the opening width W2 of the opening 23a in the stencil mask 20 is (W1−L). Making the shift width L larger enables a stencil mask with openings much smaller in opening dimensions to be formed.

Moreover, as in the first embodiment, since a plurality of silicon thin films are stacked one on top of another, the film thickness is secured, which helps increase the strength of the stencil mask.

While in the second embodiment, the two silicon thin films 24, 25 are stacked one on top of the other, this invention is not limited to this. For instance, the silicon thin film 23 may be formed by stacking three or more silicon thin films.

In the second embodiment, the first silicon thin film 24 with openings 24a and the second silicon thin films 25 with openings 25a are stacked one on top of the other in such a manner that the former is shifted from the latter. This makes it possible to make the openings 23a smaller in size than the openings 24a, 25a.

Furthermore, since the first and second silicon thin films 24, 25 are thin, this makes it possible to make microscopic openings 24a, 25a with high accuracy. In addition, since the silicon thin film 23 is composed of a plurality of silicon thin films stacked one on top of another, a sufficient strength is achieved.

Third Embodiment

Next, a stencil mask according to a third embodiment of the present invention will be explained.

FIG. 5 is a sectional view of a stencil mask 30 of the third embodiment. In each of the first and second embodiments, the stencil mask is composed of a plurality of silicon thin films with the same film thickness stacked one on top of another, each silicon thin film having a plurality of openings with the same pattern and of the same size. In contrast, the stencil mask 30 of the third embodiment is composed of a plurality of silicon thin films with different film thicknesses stacked one on top of another, each silicon thin film having openings 33a with, for example, different patterns and of different sizes.

Specifically, in FIG. 5, like the stencil mask 1 of the first embodiment, the stencil mask 30 is composed of a support part 31 and a silicon thin film 33 formed above the support part 31 with a silicon oxide film 32 between the support part 31 and the silicon thin film 33. The silicon thin film 33 has a plurality of openings 33a. The silicon thin film 33 is constructed by stacking a first silicon thin film 34 and a second silicon thin film 35 one on top of the other. The first silicon thin film 34 is made thicker than the second silicon thin film 35.

The opening pattern of the first silicon thin film 34 may be different from or equal to the opening pattern of the second silicon thin film 35. Since the second silicon thin film 35 is thinner than the first silicon thin film, microfabrication is possible in anisotropic etching to make openings. This makes it possible to form an opening pattern with smaller dimensions in the second silicon thin film 35 than those in the first silicon thin film 34. On the other hand, since the first silicon thin film 34 is thicker than the second silicon thin film, it is impossible to form a more microscopic pattern than that in the second silicon thin film 35. Therefore, in the first silicon thin film 34, a rougher opening pattern with larger dimensions than those of the opening pattern of the second silicon thin film 35 is formed.

FIGS. 6A to 6F show the processes of manufacturing the stencil mask 30.

Figure 6A:
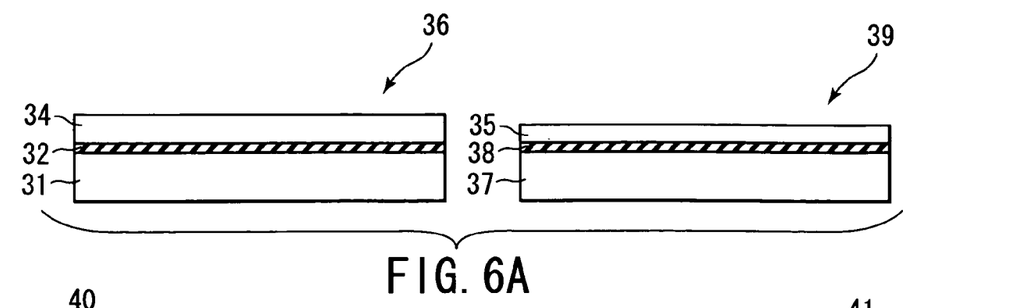
FIGS. 6A to 6F are sectional views showing the processes of manufacturing a stencil mask of the third embodiment.

FIG. 6A shows a first and a second SOI substrate 36, 39. Since the processes of manufacturing SOI substrates are the same as in the first embodiment, explanation will be omitted. The silicon thin film 34 of the first SOI substrate 36 (hereinafter, referred to as the first silicon thin film) is thicker than the silicon thin film 35 of the second SOI substrate 39 (hereinafter, referred to as the second silicon thin film). The mechanical strength of the first silicon thin film 34 is higher than that of the second silicon thin film 35.

Figure 6B:
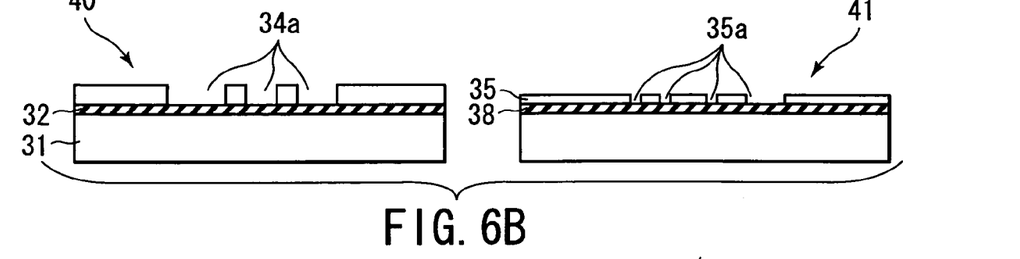

Next, as shown in FIG. 6B, a plurality of openings 34a are made in the first silicon thin film 34 and a plurality of openings 35a are made in the second silicon thin film 35. Specifically, a resist (not shown) is applied to the surface of each of the first and second silicon thin films 34, 35. Then, resist patterns are formed out of the first and second silicon thin films 34, 35 by lithographic techniques. With the resist patterns as masks, the first and second silicon thin films 34, 35 are etched anisotropically until the first and second silicon oxide films 32, 38 are exposed.

The first and second SOI substrates 36, 39 processed up to this point are called a first and a second intermediate product substrate 40, 41. The processing of the second intermediate product substrate 41 is stopped temporarily.

The opening dimensions of the openings 34a in the first silicon thin film 34 are larger and rougher. In contrast, since the second silicon thin film 35 is thinner than the first silicon thin film 34, microfabrication is possible and the openings 35a more microscopic than the openings 34a can be made. After the openings 34a, 35a are made, the resist patterns are removed.

Figure 6C:
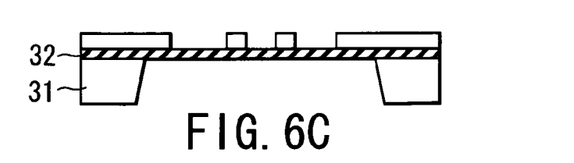

Next, as shown in FIG. 6C, a resist (not shown) is applied to the back of the first intermediate product substrate 40. Then, a resist pattern is formed by lithographic techniques. With the resist pattern as a mask, the first silicon thin film 31 is treated with chemical liquid, such as KOH, so as to etch the first silicon thin film isotropically until the first silicon oxide film 32 is exposed. In this way, the support part 31 is formed. Thereafter, the resist pattern is removed.

Figure 6D:
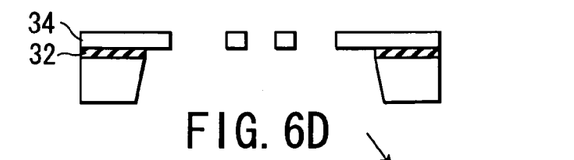

Next, the exposed first silicon oxide film 32 is processed from its back with chemical liquid, such as fluoric acid, thereby removing the first silicon oxide film 32 as shown in FIG. 6D.

Figures 6E, 6F:
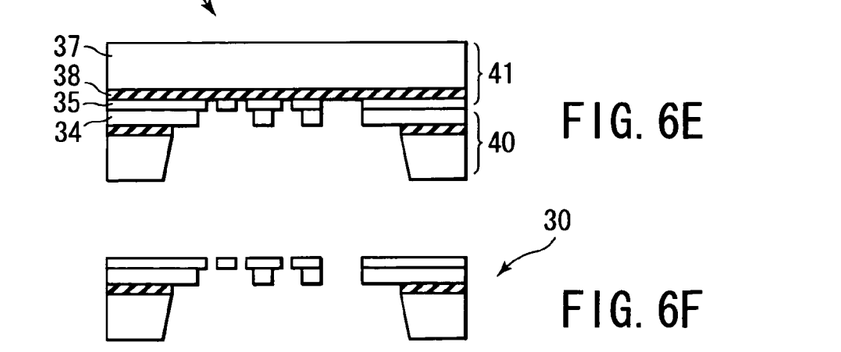

Next, as shown in FIG. 6E, the second silicon thin film 35 of the second intermediate product substrate 41 of FIG. 6B is stacked on the first silicon thin film 34 processed as shown in FIG. 6D. Thereafter, the first silicon thin film 34 and the second silicon thin film 35 are bonded together by high-temperature heat treatment. It is desirable that the first silicon thin film 34 and the second silicon thin film 35 be stacked one on top of the other in a vacuum, as in the first embodiment.

Next, as shown in FIG. 6F, the second silicon oxide film 37 is treated with chemical liquid, thereby removing the second silicon oxide film 37. Then, the second silicon oxide film 38 is treated with chemical liquid, such as fluoric acid, thereby removing the second silicon oxide film 38. In this way, the stencil mask 30 of the third embodiment is formed.

With the third embodiment, since the second silicon thin film 35 is thinner, an opening pattern with smaller opening dimensions can be made. The thinner film thickness is at a disadvantage in that its strength is low. However, since the second silicon thin film 35 is supported by the thicker first silicon thin film 34, it has a sufficient strength. Therefore, with the third embodiment, the second silicon thin film 35 enables an opening pattern with smaller opening dimensions to be formed and the first silicon thin film 34 enables a stencil mask 30 with a high mechanical strength to be manufactured.

Furthermore, when a stencil mask is manufactured using only the second silicon thin film 35 with a thinner film thickness, the stencil mask could not stand by itself when the insulating film at the back of the second silicon thin film 35 is removed after the formation of the support part and therefore might be deformed or destroyed. However, by supporting the second silicon thin film 35 with the first silicon thin film 34 as in the first embodiment, the deformation or destruction of the second silicon thin film 35 can be avoided.

In FIG. 5, the support part 31 is formed on the silicon thin film 34 with the silicon oxide film 32. However, as shown in the circle of FIG. 5, the support part 31 may be formed on the silicone thin film 35 with silicon oxide film 32.

Figure 7:
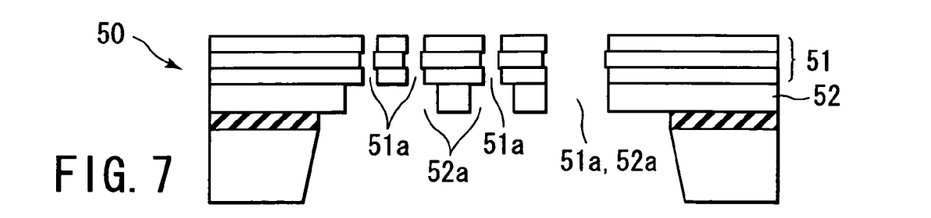
FIG. 7 is a sectional view of a stencil mask of the third embodiment.

FIG. 7 shows a modification of the third embodiment. As shown in FIG. 7, two or more thin silicon thin films are stacked one on top of another in such a manner that they are shifted from one another, thereby forming a silicon thin film 51. The silicon thin film 51 is supported by a thick silicon thin film 52. The openings 51a made in the silicon thin film 51 are made smaller than the openings made in each silicon thin film. The openings 51a made in the silicon thin film 51 are caused to correspond to the openings 52a made in the silicon thin film 52. In this case, a plurality of openings 51a may be caused to correspond to one opening 52a. With this configuration, it is possible to form a stencil mask 50 having an opening pattern with much smaller dimensions.

Fourth Embodiment

Next, a stencil mask according to a fourth embodiment of the present invention will be explained.

Figure 8:
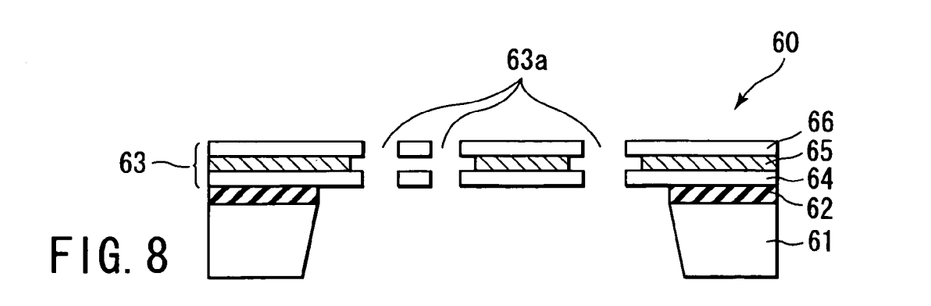
FIG. 8 is a sectional view of a stencil mask according to a fourth embodiment of the present invention.

FIG. 8 is a sectional view of a stencil mask 60 according to the fourth embodiment. The fourth embodiment is related to a stencil mask whose conductivity is better and whose strength is higher than those in the first to third embodiments.

In FIG. 8, the stencil mask 60 is composed of a support part 61 and a silicon thin film 63 formed above the support part 61 with a silicon oxide film 62 between the support part 61 and the silicon thin film 63. The silicon thin film 63 has a plurality of openings 63a in it. The silicon thin film 63 has a first silicon thin film 64, a second silicon thin film 65, and a tungsten film 66 provided between the first and second silicon thin films 64, 65. The first and second silicon thin films 64, 65 are thin and therefor an opening pattern with small dimensions can be formed.

Next, the processes of manufacturing the stencil mask 60 of the fourth embodiment will be explained by reference to FIGS. 9A to 9F.

Figure 9A:
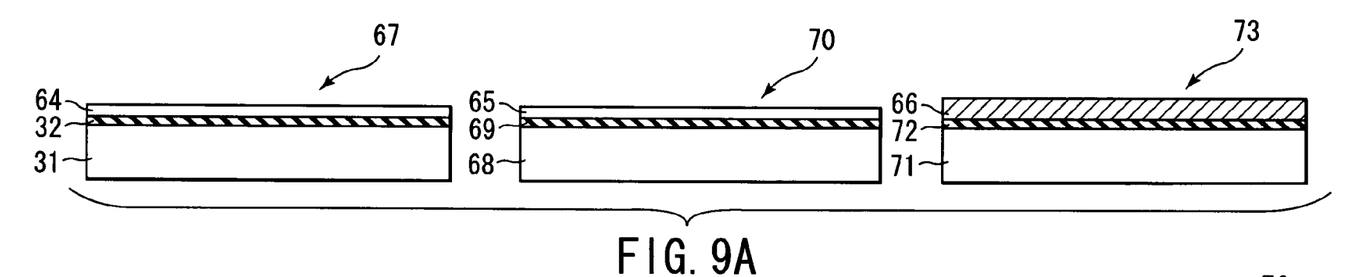
FIGS. 9A to 9F are sectional views showing the processes of manufacturing a stencil mask of the fourth embodiment.

In FIG. 9A, a first SOI substrate 67 is composed of a first silicon substrate 61, a first silicon oxide film 62, and a first silicon thin film 64. A second SOI substrate 70 is composed of a second silicon substrate 68, a second silicon oxide film 69, and a second silicon thin film 65. Since the processes of manufacturing the first and second SOI substrates 67, 70 are the same as in the first embodiment, explanation will be omitted. A third substrate 73 is composed of a silicon substrate 71, a silicon oxide film 72, and a tungsten film 66. The third substrate is formed as follows. The silicon substrate 71 is heated in an atmosphere of oxygen, thereby forming a silicon oxide film 72 on the silicon substrate 71. Thereafter, a tungsten film 66 is deposited on the silicon oxide film 72 to a thickness of about 1 μm by sputtering techniques.

Figures 9B, 9C, 9D:
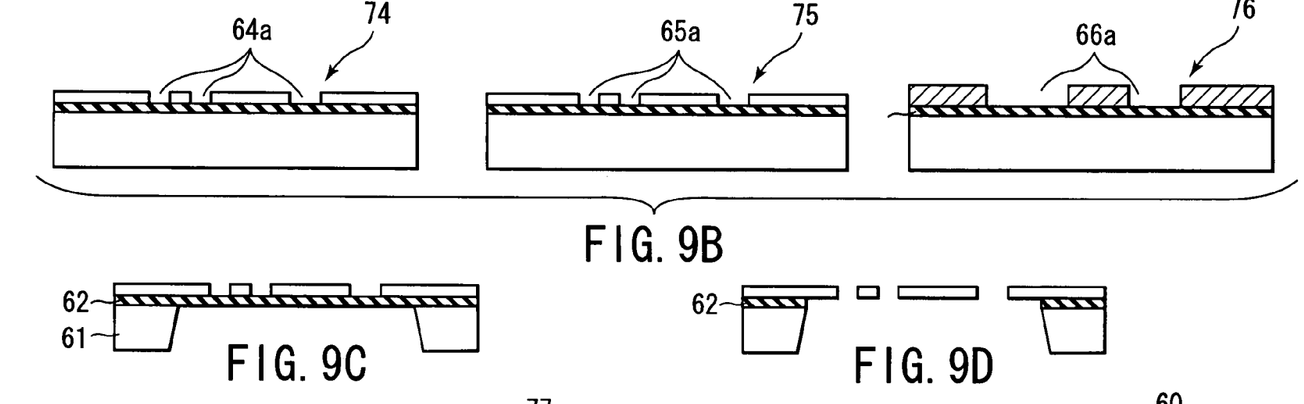

Next, as shown in FIG. 9B, a resist (not shown) is applied to the surface of the tungsten film 66. Then, a resist pattern is formed using lithographic techniques. Moreover, a resist (not shown) is applied to the surface of each of the first and second silicon thin films 64, 65. Then, a resist pattern is formed on each of the first and second silicon thin films by lithographic techniques. With these resist patterns as masks, the tungsten film 66 and the first and second silicon thin films 64, 65 are etched anisotropically until the silicon oxide film is exposed. In this way, openings 66a, 64a, 65a are made in the tungsten film 66 and the first and second silicon thin films 64, 65, respectively. Thereafter, the resist patterns are removed.

The processed first and second SOI substrates 67, 70 are referred to as a first and a second intermediate product substrate 74, 75. The processed third substrate 73 is referred to as a third intermediate product substrate 76. Here, the processing of the second and third intermediate product substrates 75, 76 is stopped temporarily.

Next, as shown in FIG. 9C, a resist (not shown) is applied to the back of the first silicon substrate 61. Then, a resist pattern is formed using lithographic techniques. With the resist pattern as a mask, the first silicon substrate 61 is treated with chemical liquid, such as KOH. Specifically, the first silicon substrate 61 is etched isotropically until the first silicon oxide film 62 is exposed, thereby forming the support part 61. Thereafter, the resist pattern is removed.

Next, as shown in FIG. 9D, the first silicon oxide film 62 is treated from its back with chemical liquid, such as fluoric acid, thereby removing the first silicon oxide film 62.

Figure 9E:
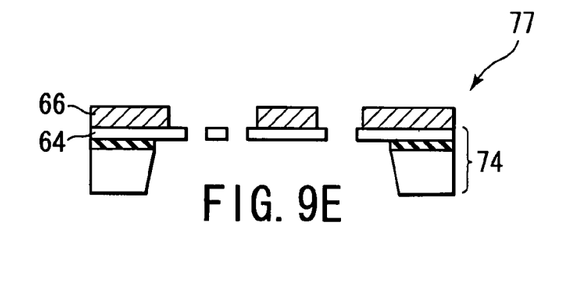

Next, as shown in FIG. 9E, the tungsten film 66 of the third intermediate product substrate 76 of FIG. 9B is stacked on the first silicon oxide film 64. Thereafter, the first silicon thin film 64 and the tungsten film 66 are bonded together by high-temperature heat treatment. It is desirable that this treatment be carried out in a vacuum, as in the first embodiment. Next, the third silicon substrate 71 is treated with chemical liquid, such as KOH, thereby removing the third silicon substrate 71. Then, the third silicon oxide film 72 is treated with chemical liquid, such as fluoric acid, thereby removing the third silicon oxide film 72. In this way, the patterned tungsten film 66 is exposed, thereby producing a fourth intermediate product substrate 77.

Figure 9F:
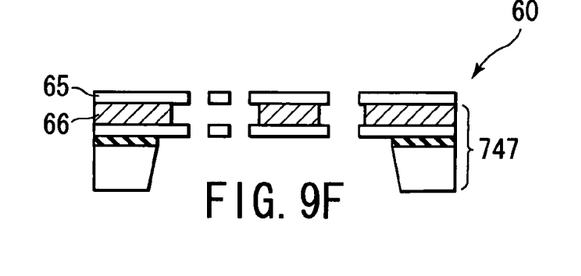

Next, as shown in FIG. 9F, the second silicon thin film 65 of the second intermediate product substrate 75 of FIG. 9B is stacked on the tungsten film 66 of the fourth intermediate product substrate 77. Thereafter, the tungsten film 66 and the second silicon thin film 65 are bonded together by high-temperature treatment. In this case, too, it is desirable that the heat treatment be carried out in a vacuum. Then, the second silicon substrate 65 is treated with chemical liquid, such as KOH, thereby removing the second silicon substrate. Moreover, the second silicon oxide film 69 is treated with chemical liquid, such as fluoric acid, thereby removing the second silicon oxide film 69. In this way, the stencil mask 60 of the fourth embodiment is formed.

With the fourth embodiment, since the first and second silicon thin films 64, 65 are thinner, the openings 64a, 65a have smaller opening dimensions. In addition, the tungsten film 66 with a high electrical conductivity and a high thermal conductivity is sandwiched between the first and second silicon thin films 64, 65. This makes it possible to increase the electrical conductivity and thermal conductivity of the stencil mask 60. Moreover, since the tungsten film 66 has a higher strength than a silicon film, the mechanical strength can be increased.

The conductive film provided on each of the first and second silicon thin films 64, 65 is not limited to a tungsten film and may be another metal or compound with a high electrical conductivity or a high thermal conductivity.

When the size of the opening 66a in the tungsten film 66 is smaller than that of the opening 64a or 65a, the tungsten film 66 extends into the opening 64a or 65a. In such a configuration, particles collide with the tungsten film 66 in ion implantation, which can contaminate the substrate to be processed (a semiconductor substrate). In the stencil mask 60 of the fourth embodiment, the size of the opening 66a in the tungsten film 66 is set larger than the size of each of the openings 64a, 65a. This prevents the tungsten film 66 from extending into the openings 64a, 65a. Consequently, the problem of contaminating the semiconductor substrate will not arise.

Fifth Embodiment

Figure 10:
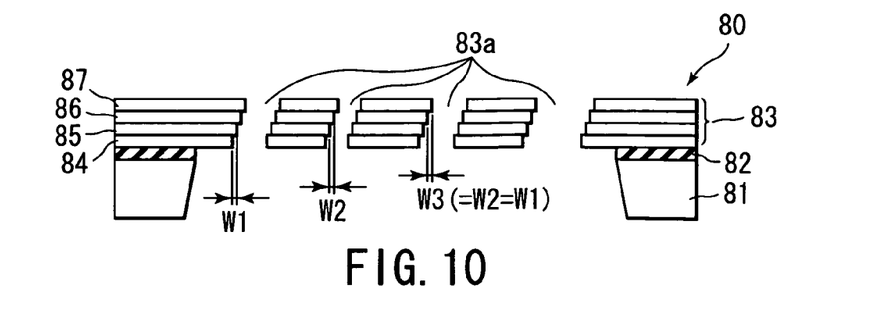
FIG. 10 is a sectional view of a stencil mask according to a fifth embodiment of the present invention.

Next, a stencil mask according to a fifth embodiment of the present invention will be explained. FIG. 10 is a sectional view of a stencil mask 80 according to the fifth embodiment.

Like the stencil mask 1 of the first embodiment, the stencil mask 80 is composed of a silicon thin film 83 formed above a support part 81 with a silicon oxide film 82 between the support part 81 and the silicon thin film 83. In the silicon thin film 83, openings 83a are made. The silicon thin film 83 is composed of four layers of a first to a fourth silicon thin film 84, 85, 86, 86 stacked one on top of another. Each of the first to fourth silicon thin films 84, 85, 86, 87 has a plurality of openings of the same shape and size. The first to fourth silicon thin films 84, 85, 86, 87 are stacked one on top of another in such a manner that the openings in each of the silicon thin films are shifted little by little in a specific direction. Specifically, the shift quantity W1 between the first silicon thin film 84 and the second silicon thin film 85, the shift quantity W2 between the second silicon thin film 85 and the third silicon thin film 86, and the shift quantity W3 between the third silicon thin film 86 and the fourth silicon thin film 87 are set to almost the same value.

With the fifth embodiment, since the first to fourth silicon thin films 84, 85, 86, 87 are thin, microfabrication is possible and an opening pattern with smaller opening dimensions can be formed in each of the first to fourth silicon thin films 84, 85, 86, 87.

Furthermore, the openings made in each of the first to fourth silicon thin films 84, 85, 86, 87 are arranged in such a manner that they are shifted at regular intervals, with the result that the sidewalls of the openings 83a in the stencil mask 80 are formed almost obliquely. Use of the stencil mask 80 of the fifth embodiment prevents shadowing when particles are directed to the substrate to be processed (semiconductor substrate). Therefore, it is possible to prevent the particle implantation area for the semiconductor substrate from becoming smaller. That is, particles can be implanted into the semiconductor substrate, with the width of the opening 83a in the stencil mask 80 remaining constant.

Although the first to fourth silicon thin films 84, 85, 86, 87 of FIG. 10 are caused to have the same thickness, the present invention is not limited to this.

Figure 11:
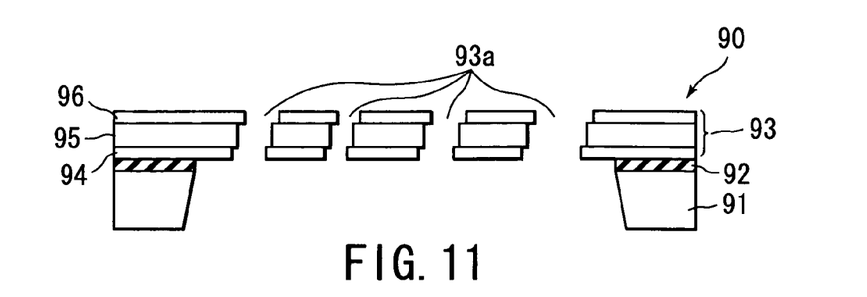
FIG. 11 is a sectional view of a stencil mask of to the fifth embodiment.

FIG. 11 is a modification of FIG. 10, which shows a case where a plurality of silicon thin films differing in film thickness are used. Specifically, in FIG. 11, a silicon thin film 93 has a second silicon thin film 95 sandwiched between a first silicon thin film 94 and a third silicon thin film 96 which are thin. The second silicon thin film 95 is thicker than the first and third silicon thin films 94, 96. Since the second silicon thin film 95 is thicker, it is difficult to make smaller the opening dimensions of the opening pattern for the second silicon thin film 95. However, the thicker second silicon thin film 95 enables the mechanical strength to increase and therefore reduce the silicon thin film bonding processes. In addition, since the first and third silicon thin films 94, 96 can be processed microscopically, the stencil mask 90 enables an opening pattern with smaller opening dimensions to be formed.

Figure 12:
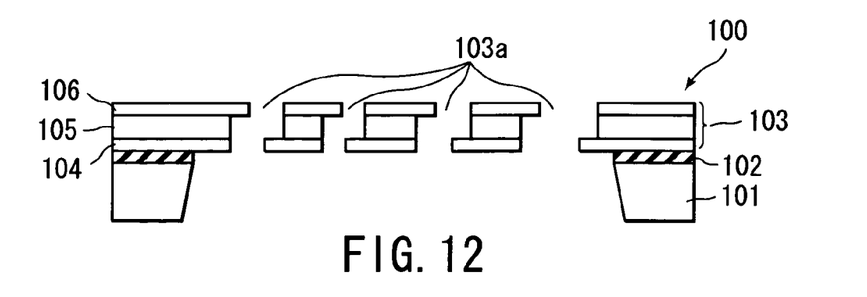
FIG. 12 is a sectional view of a stencil mask of to the fifth embodiment.

FIG. 12 shows another modification of FIG. 10. In the silicon thin films 83 or 93 of the stencil mask 80 or 90 shown in FIG. 10 or FIG. 11, all of the silicon thin films are shifted little by little, thereby forming oblique opening patterns. In contrast, in a case of FIG. 12, a stencil mask 100 is composed of a first and a third silicon thin film 104, 106 which are thin and a second silicon thin film 105 provided between the first and third silicon thin films. The second silicon thin film 105 is thicker than the first and third silicon thin film 104, 106. The stencil mask 100 has a plurality of oblique openings 103a in it. The oblique opening 103a is made up of the third silicon thin film 106 at the top layer and the first silicon thin film 104 at the bottom layer. The silicon thin film 105, which supports the first and third silicon thin films 104, 106, is provided to maintain the mechanical strength.

Even the configurations shown in FIGS. 11 and 12 produce the same effect as that of the fifth embodiment.

Sixth Embodiment

Next, a stencil mask according to a sixth embodiment of the present invention will be explained.

Figure 13A:
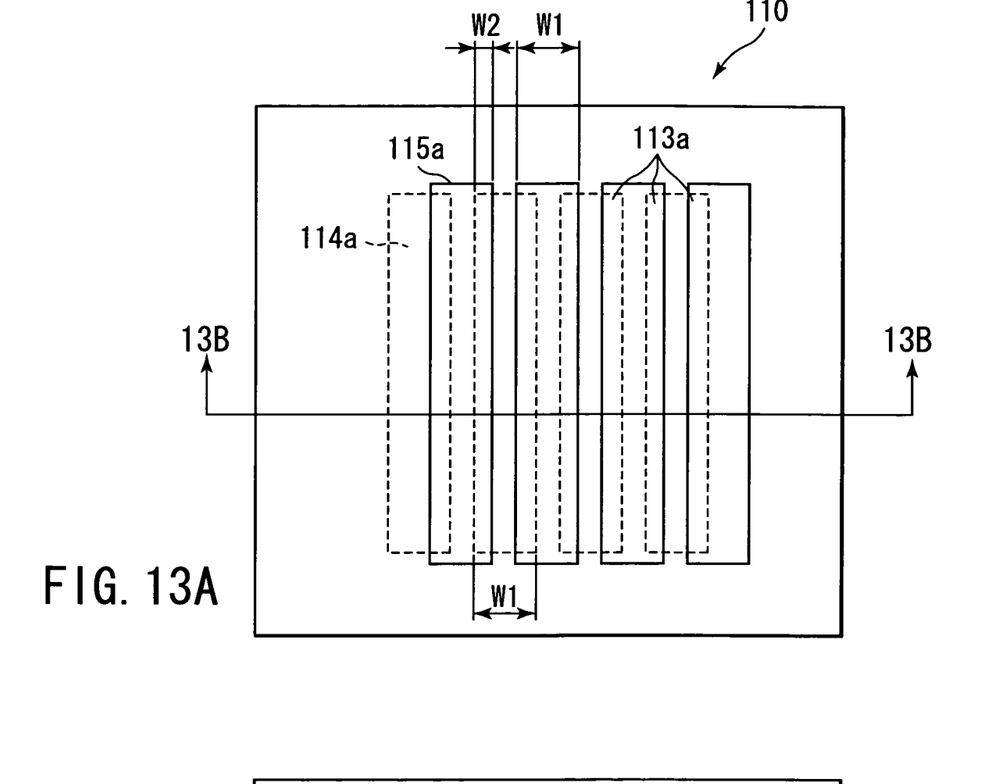
FIG. 13A is a plan view of a stencil mask according to a sixth embodiment of the present invention.
Figure 13B:
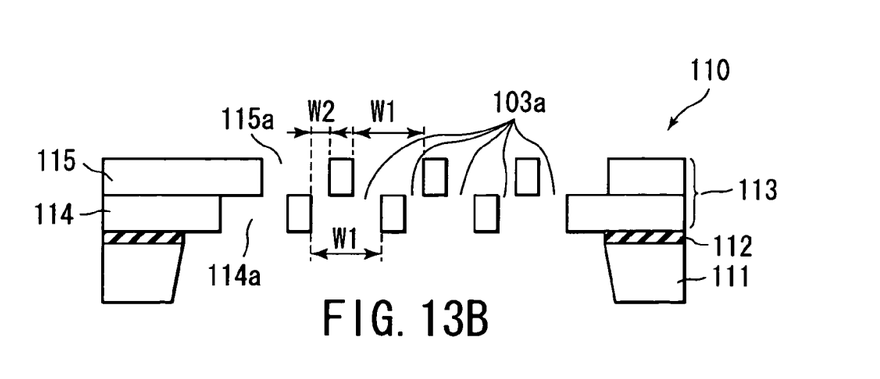
FIG. 13B is a sectional view along with the line 13B-13B shown in FIG. 13A.
Figure 13C:
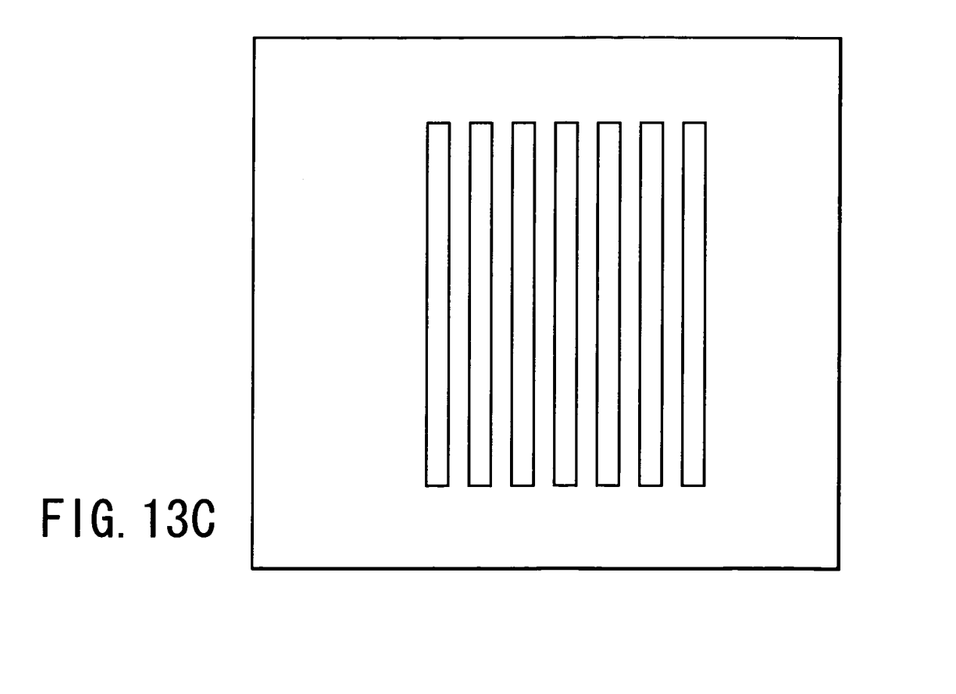
FIG. 13C is a plan view showing a opening pattern of the stencil mask shown in FIG. 13A.

FIGS. 13A and 13B show a stencil mask 110 according to the sixth embodiment.

The stencil mask 110 is composed of a support part 111 and a silicon thin film 113 formed above the support part 111 with a silicon oxide film 112 between the support part and the silicon thin film. The silicon thin film 113 has a plurality of openings 113a in it. The silicon thin film 113 is composed of a first silicon thin film 114 and a second silicon thin film 115 stacked one on top of the other. The first and second silicon thin films 114, 115 are composed of relatively thick silicon thin films. Openings 114a made in the first silicon thin film 114 and openings 115a made in the second silicon thin film 115 are of the same shape and of the same size and differ in position. A portion between the openings 114a faces to the opening 115a, and portion between the openings 115a faces to the opening 114a. Therefore, as shown in FIGS. 13A and 13B, the first silicon thin film 114 and the second silicon thin film 115 are not bonded together at the openings 114a and 115a. With the second silicon thin film 115 stacked on the first silicon thin film 114, the portions where the openings 114a face the openings 115a corresponding to the openings 113a in the stencil mask 110. Even when the width of the opening 114a and that of the opening 115a are both W1, it is possible to form a stencil mask 110 with the openings 113a whose width W2 is smaller than the width W1.

With the sixth embodiment, even when the first and second silicon thin films 114, 115 are thick and it is difficult to make openings with smaller dimensions in each of the silicon thin films 114, 115, the openings 113a smaller than the openings 114a, 115a can be formed in the stencil mask 110 by stacking the openings 114a and the openings 115a one on top of another in such a manner that the former are shifted from the latter. Since each of the silicon thin films 114, 115 is thick, the stencil mask 110 with a sufficient mechanical strength can be formed.

In the sixth embodiment, all of the opening pattern regions of the first silicon thin film 114 and second silicon thin film 115 are not bonded together. That is, the explanation has been given about the stencil mask 110 where the region between the openings 114a is not bonded to the region between the openings 115a. The present invention is not limited to this.

Figure 14:
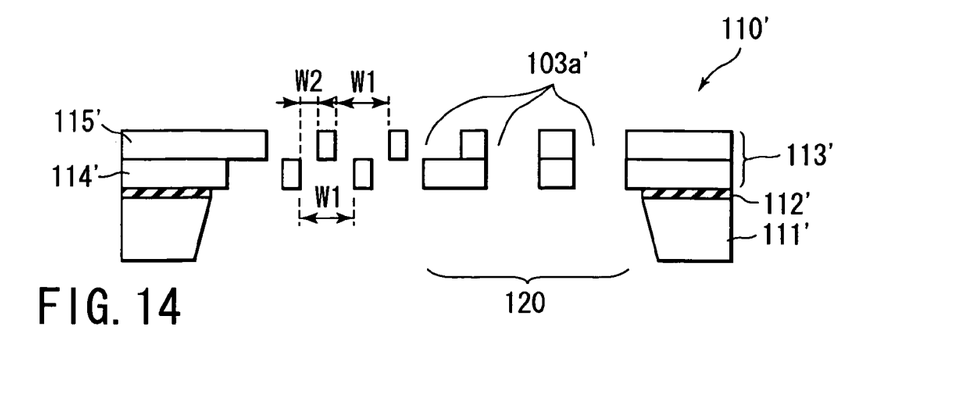
FIG. 14 is a sectional view showing a modification of the stencil mask of the sixth embodiment.

FIG. 14 shows a modification of the sixth embodiment. As in a stencil mask 110' of FIG. 14, a first and a second silicon thin film 114', 115' between the openings 113a' may be bonded together in a region 120 where, for example, openings with smaller dimensions are not required.

The present invention is not limited to the above embodiments. For instance, the number of silicon thin films constituting a stencil mask is not restricted to the numbers in the embodiments. The thinner each silicon thin film is made, the more microscopically it can be processed and the lower the mechanical strength becomes. Therefore, it is necessary to increase the number of silicon thin films stacked one on top of another.

Furthermore, although silicon has been used for the thin films and support parts, each embodiment is not limited to this. Any material may be used, as long as it does not contaminate a substrate to be processed. Therefore, a material whose main component is the same element as or an equivalent element to that of the substrate to be processed should be used. In each of the embodiments, since the substrate to be processed is made of silicon, SiC, $Si_3N_4$ or the like may be used as a material for the stencil mask.

In addition, after the silicon thin films are stacked on top of another, they are bonded together by high-temperature heat treatment. Each embodiment is not restricted to this. For instance, an adhesive member or the like may be inserted between the silicon thin films.

Moreover, the SOI substrate manufacturing method, the method of manufacturing a single silicon thin film before silicon thin films are stacked one on top of another, and the method of manufacturing the intermediate product substrates are not limited to those explained in the above embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A stencil mask comprising:
  a transfer mask which is configured by at least three thin films stacked one on top of another, each of the thin films having a first opening, the transfer mask having a second opening which is configured by the first openings; and
  a support part formed on one face of the transfer mask,
  wherein the second opening in the transfer mask, having smaller dimensions than each of the first openings in the thin films, is formed by shifting the first openings from each other.

2. The stencil mask according to claim 1, wherein the first openings in the thin films have the same size.

3. The stencil mask according to claim 1, further comprising an insulating film formed between the transfer mask and the support part.

4. A stencil mask comprising:
  a first thin film which has a first opening of a specific pattern;
  a second thin film which is stacked on one side of the first thin film and has the same pattern as that of the first opening; and a support part formed on the other side of the first thin films, wherein the second opening is laid on the first opening in such a manner that the second opening is shifted from the first opening.

5. The stencil mask according to claim 4, wherein a third opening formed by stacking the first thin film and the second thin film one on top of the other has smaller opening dimensions than those of the first and second openings.

6. The stencil mask according to claim 4, further comprising a third thin film which is formed between the first thin film and the second thin film and has a fourth opening, and whose electrical conductivity or thermal conductivity is higher than the electrical conductivity or thermal conductivity of each of the first and second thin films.

7. The stencil mask according to claim 4, further comprising an insulating film formed between the first thin film and the support part.

8. A stencil mask comprising:
a first thin film which has a first opening; and
a second thin film which is stacked on one side of the first thin film and has a second opening whose dimensions are smaller than those of the first opening,
wherein the first thin film is thicker than the second thin film.

9. The stencil mask according to claim 8, further comprising:
a support part formed on another surface of the first thin film; and
an insulating film formed between the another surface of the first thin film and the support part.

10. The stencil mask according to claim 8, further comprising:
a support part formed on the second thin film; and
an insulating film formed between the second thin film and the support part.

11. The stencil mask according to claim 8, further comprising a third thin film which is formed between the first thin film and the second thin film and has a third opening, and whose electrical conductivity or thermal conductivity is higher than the electrical conductivity or thermal conductivity of each of the first and second thin films.

12. The stencil mask according to claim 8, wherein the third opening has larger dimensions than those of each of the first and second openings.

13. The stencil mask according to claim 8, further comprising an insulating film formed between the first thin film and the support part.

14. A stencil mask comprising:
a first thin film which has a first region, a second region, and a third region, the first region and the second region each having a first opening;
a second thin film which is stacked on one side of the first thin film and has a fourth region corresponding to the first region, a fifth region corresponding to the second region, and a sixth region corresponding to the third region and which a second opening in each of the fourth region and the fifth region; and
a support part formed in a region corresponding to the third region on the other side of the first thin film, the first thin film and the second thin film not being bonded together between the first region and the fourth region but being bonded between the second region and the fifth region and between the third region and the sixth region.

15. The stencil mask according to claim 14, further comprising an insulating film formed between the third thin film and the support part.

16. The stencil mask according to claim 14, wherein the first and second thin films are made of a material whose main component is identical or equivalent to the element of the substrate to be processed.

* * * * *